United States Patent
Lee et al.

(10) Patent No.: US 8,203,165 B2
(45) Date of Patent: Jun. 19, 2012

(54) CERAMIC PACKAGE FOR HEADLAMP AND HEADLAMP MODUL HAVING THE SAME

(75) Inventors: Young Jin Lee, Seoul (KR); Hyung Kun Kim, Suwon (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 494 days.

(21) Appl. No.: 12/343,455

(22) Filed: Dec. 23, 2008

(65) Prior Publication Data

US 2010/0127300 A1 May 27, 2010

(30) Foreign Application Priority Data

Nov. 27, 2008 (KR) .................. 10-2008-0119183

(51) Int. Cl.
*H01L 31/00* (2006.01)
(52) U.S. Cl. ... 257/99; 257/712; 257/730; 257/E33.055; 257/E33.065; 257/E33.075
(58) Field of Classification Search .............. 257/99, 257/712, 718, 727, 730, E33.055, E33.066, 257/E33.075, E33.065
See application file for complete search history.

(56) References Cited

U.S. PATENT DOCUMENTS

| | | | |
|---|---|---|---|
| 5,647,034 A * | 7/1997 | Matsuda et al. | 385/16 |
| 5,999,501 A * | 12/1999 | Tomita et al. | 369/44.15 |
| 6,355,946 B1 * | 3/2002 | Ishinaga | 257/98 |
| 6,943,433 B2 * | 9/2005 | Kamada | 257/666 |
| 7,137,852 B2 * | 11/2006 | Tsukamoto | 439/698 |
| 7,425,083 B2 * | 9/2008 | Kim et al. | 362/294 |
| 7,495,322 B2 * | 2/2009 | Hashimoto et al. | 257/676 |
| 7,557,384 B2 * | 7/2009 | Matsumoto et al. | 257/99 |
| 7,592,638 B2 * | 9/2009 | Kim | 257/98 |
| 7,626,250 B2 * | 12/2009 | Lee et al. | 257/675 |
| 7,791,100 B2 * | 9/2010 | Lee et al. | 257/103 |
| 7,906,794 B2 * | 3/2011 | Harrah et al. | 257/99 |
| 8,053,799 B2 * | 11/2011 | Kwon et al. | 257/98 |
| 2005/0045904 A1 * | 3/2005 | Chen | 257/100 |
| 2005/0139846 A1 * | 6/2005 | Park et al. | 257/98 |
| 2005/0161682 A1 * | 7/2005 | Mazzochette et al. | 257/79 |
| 2006/0220050 A1 * | 10/2006 | Higaki et al. | 257/99 |
| 2007/0057364 A1 * | 3/2007 | Wang et al. | 257/701 |
| 2008/0008427 A1 * | 1/2008 | Takeda et al. | 385/92 |
| 2009/0039382 A1 * | 2/2009 | Su | 257/99 |
| 2009/0166661 A1 * | 7/2009 | Sheu et al. | 257/99 |
| 2009/0261374 A1 * | 10/2009 | Hayashi | 257/99 |
| 2010/0032189 A1 * | 2/2010 | Muto et al. | 174/252 |

(Continued)

FOREIGN PATENT DOCUMENTS

JP    2000-183407    6/2000

(Continued)

*Primary Examiner* — Ha Tran T Nguyen
*Assistant Examiner* — Jordan Klein
(74) *Attorney, Agent, or Firm* — McDermott Will & Emery, LLP (57) ABSTRACT

Provided is a ceramic package for headlamp, and a headlamp module having the same. The ceramic package for headlamp includes a body part, a pair of internal electrodes, and an electrode exposing part. The body part has a cavity formed therein. The cavity is upwardly opened to expose a light emitting diode mounted on a mounting part. The pair of internal electrodes in the body part is electrically connected to the light emitting diode. The electrode exposing part is stepped at either side of the body part to upwardly expose the internal electrode to the outside.

14 Claims, 7 Drawing Sheets

U.S. PATENT DOCUMENTS

2010/0264430 A1* 10/2010 Takamura ................ 257/88

FOREIGN PATENT DOCUMENTS

| | | |
|---|---|---|
| JP | 2003-011417 | 1/2003 |
| JP | 2006-005091 | 1/2006 |
| JP | 2007-311640 | 11/2007 |
| JP | 2008-016362 | 1/2008 |
| WO | WO 2005/020338 | 3/2005 |

* cited by examiner

CERAMIC PACKAGE FOR HEADLAMP AND HEADLAMP MODUL HAVING THE SAME

CROSS-REFERENCE TO RELATED APPLICATIONS

This application claims the priority of Korean Patent Application No. 2008-0119183 filed on Nov. 27, 2008, in the Korean Intellectual Property Office, the disclosure of which is incorporated herein by reference.

BACKGROUND OF THE INVENTION

1. Field of the Invention

The present invention relates to a ceramic package for headlamp and a headlamp module having the same, and more particularly, to a ceramic package for headlamp and a headlamp module having the same, which can improve the heat dissipation characteristics by smoothly releasing heat from the ceramic package coupled to the heat transfer metal substrate.

2. Description of the Related Art

In general, a Light Emitting Diode (LED) refers to a semiconductor device capable of emitting various colors by creating a light emitting source using compound semiconductor material of GaAs, AlGaAs, GaN, InGaInP, etc.

As light sources using the LED emerge one after another, small-sized packages, which were developed for a mobile device at first, are being increasingly used for a large-sized TV, an advertizing board, an illuminator, a headlamp for vehicles, etc. Accordingly, the size of the package is being steadily increased.

In such an environment, the package requires a different structure from typical semiconductor packages because the package embedded with a LED should exert high efficiency, high reliability, thermal and electrical reliability, and optical characteristics.

Generally, a related art package using a low-power and low-output LED includes a metal plating layer on a plastic material because plastic may be easily processed in a desired reflection angle and structure.

Recently, as development of a high-power and high-output LED for general illuminators and automobile headlamps is being progressed, a material having excellent heat resistance and heat transfer property becomes required. A ceramic has been spotlighted as a material capable of meeting the requirements.

Among the ceramics, the high temperature co-fired ceramic (HTCC) having the excellent thermal characteristics has been more widely used than the low temperature co-fired ceramic (LTCC) focused on the delivery and protection function of signal.

The performance of the light emitting diode is highly dependent on the heat transfer characteristics. Also, the optical output may be increased due to the excellent heat transfer characteristics if a low temperature is maintained despite the same amount of current flow. Accordingly, the heat transfer characteristics are very important to the light emitting diode.

As a method of attaching ceramic package to a module, a surface mount device (SMD) type is widely used. According to this method, both negative and positive polarities coexist on the bottom surface because a typical lead does not protrude to the outside.

If the both polarities coexist on the same plane, a non-conductive insulating layer must necessarily be intervened between the ceramic package and the heat transfer metal substrate. This may cause deterioration of the heat transfer characteristics.

SUMMARY OF THE INVENTION

An aspect of the present invention provides to a ceramic package for headlamp and a headlamp module having the same, which can maximize the optical efficiency through improving the heat dissipation characteristics by smoothly releasing heat from the ceramic package coupled to the heat transfer metal substrate.

According to an aspect of the present invention, there is provided a ceramic package for headlamp having a light emitting diode, including: a body part having a cavity formed therein, the cavity being opened upwardly to expose the light emitting diode mounted on a mounting part; a pair of internal electrodes in the body part electrically connected to the light emitting diode; and an electrode exposing part stepped at either side of the body part to upwardly expose the internal electrode to the outside.

The body part may be formed by laminating a ceramic substrate manufactured through High Temperature Co-fire Ceramic (HTCC) process.

The electrode exposing part may be formed by laminating a ceramic substrate having either end cut inward along a lengthwise direction of the body part on a top end of the ceramic substrate, the ceramic substrate cut inward having a sectional area less than that of the ceramic substrate therebelow.

The electrode exposing part may be formed by laminating a ceramic substrate having recessed portions at either end thereof on a top end of the ceramic substrate, the ceramic substrate with the recessed portions having a sectional area identical to that of the ceramic substrate therebelow.

The electrode exposing part may be stepped to be upwardly exposed to the outside by inwardly depressing a portion of upper and side surfaces of either side of the body part.

The electrode exposing part may be stepped to be upwardly exposed to the outside by inwardly depressing top and side surfaces of either side of the body part along a lengthwise direction of the body part.

The top surface of the internal electrode may be upwardly exposed to the outside by the electrode exposing part at either side of the body part.

The top surface and the side surface of the internal electrode may be upwardly and horizontally exposed to the outside by the electrode exposing part at either side of the body part, respectively.

The internal electrodes may have different polarities electrically connected to the light emitting diode.

The body part further may include a via hole penetrating the mounting part, and a plating layer electrically connected to the via hole under the body part.

The pair of internal electrodes may have the same polarity, while the via hole and the plating layer have different polarities.

The body part may include a reflection surface downwardly declined toward the bottom surface of the cavity.

The ceramic package for headlamp further may include a molding member filled in the cavity to cover the light emitting diode.

According to another aspect of the present invention, there is provided a headlamp module including: a ceramic package including a body part having a cavity formed therein, the cavity being opened upwardly to expose the light emitting diode mounted on a mounting part, a pair of internal electrodes in the body part electrically connected to the light emitting diode, and an electrode exposing part stepped at either side of the body part to upwardly expose the internal electrode to the outside; and a substrate including a seating part fixed on the ceramic package, an insulating layer disposed along an outer edge of the seating part, and an external electrode patterned on the insulating layer.

When the ceramic package is seated on the seating part, the electrode exposing part may face the insulating layer.

The electrode exposing part may have the substantially same height as the height of the insulating layer.

The internal electrodes may have different polarities, electrically connected to the external electrode.

The ceramic package further may include a via hole penetrating the mounting part of the body part, and a plating layer under the seating part electrically connected to the via hole.

The internal electrodes may have the same polarity and electrically connected to the external electrode on the insulating layer, while the via hole and the plating layer may have different polarities and electrically connected to the substrate.

The internal electrode may be electrically connected to the external electrode through one of a solder, a metal wire and a leaf-spring.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
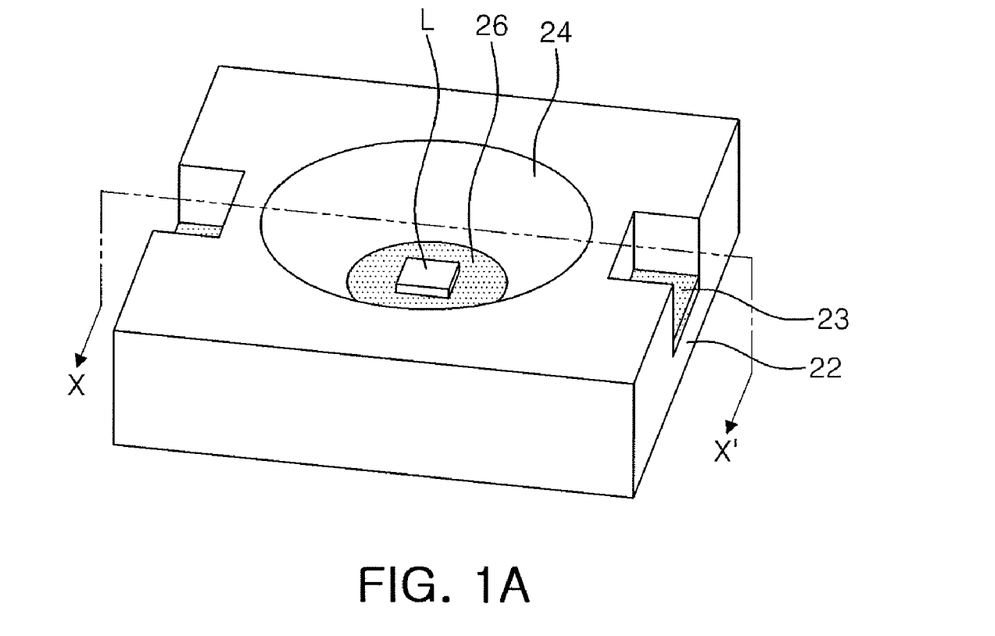
FIGS. 1a and 1b are perspective views illustrating a ceramic package for headlamp according to an embodiment of the present invention, respectively.
Figure 1B:
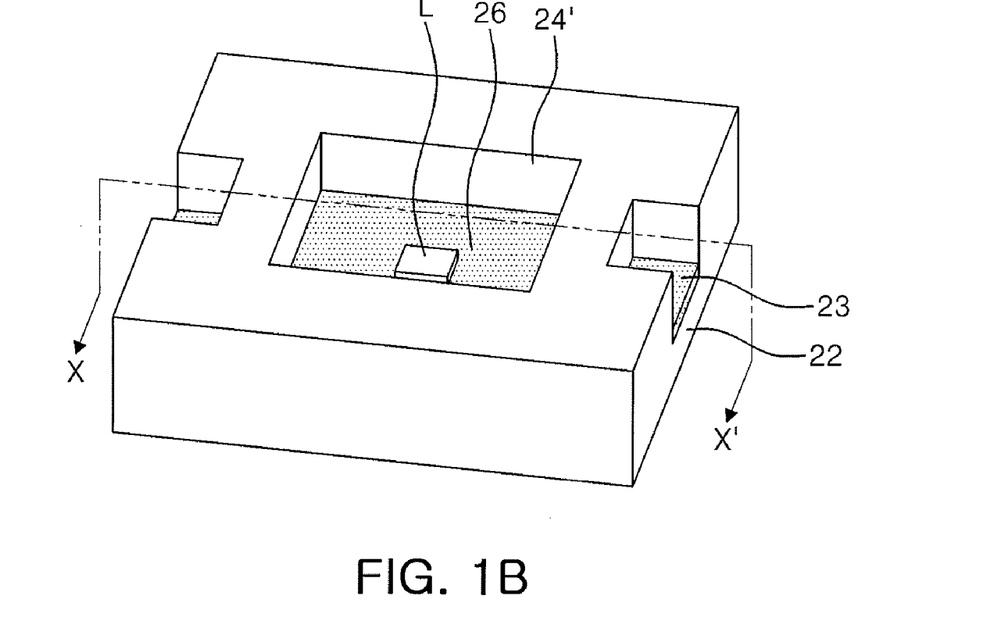
Figure 2A:
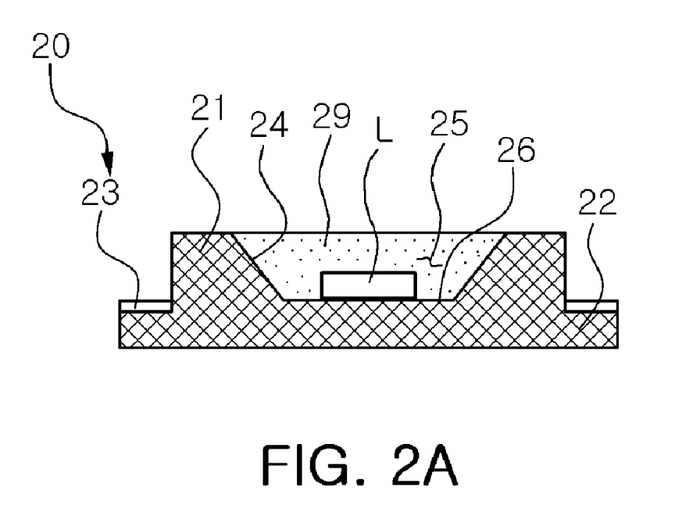
FIG. 2a is a sectional view taken along line X-X' of the ceramic package for headlamp as described in FIG. 1.
Figure 2B:
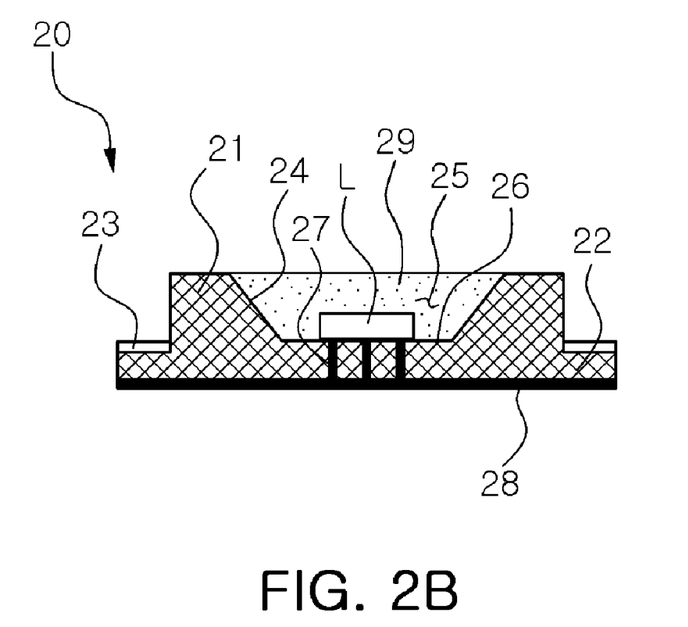
FIG. 2b is a sectional view illustrating a ceramic package for headlamp according to another embodiment of the present invention.

FIGS. 1a and 1b are perspective views illustrating a ceramic package for headlamp according to an embodiment of the present invention, respectively. FIG. 2a is a sectional view taken along line X-X' of the ceramic package for headlamp as described in FIG. 1. FIG. 2b is a sectional view illustrating a ceramic package for headlamp according to another embodiment of the present invention.

First, a ceramic package for headlamp according to an embodiment of the present invention will be described with reference to FIGS. 1 and 2.

As described in FIGS. 1 and 2, a headlamp ceramic package 20 according to an embodiment of the present invention includes a body part 21, an electrode exposing part 22, and an internal electrode 23.

The body part 21 is formed by laminating a plurality of ceramic substrates manufactured through a High Temperature Co-fired Ceramic (HTCC) process.

A cavity 25, which is upwardly opened, is formed in the body part 21, so that a light emitting diode L is mounted on a mounting part 26 to be exposed to the outside.

The inner surface of the cavity 25 is declined toward the mounting part 26 to form a reflection surface 24 and 24'. This allows the light emitted from the light emitting diode L to be reflected by the reflection surface 24 and 24', thereby enhancing the optical efficiency.

For a more efficient implementation, the reflection surface 24 and 24' may be covered with a reflection layer having a high reflexibility.

As described FIGS. 1 and 2, the electrode exposing part 22 is outwardly stepped at either side of the body part 21 so as to be exposed to the outside.

The electrode exposing part 22 may be formed by laminating a ceramic substrate having either end cut inward along a lengthwise direction of the body part 21 on the top surface of the ceramic substrate forming the body part 21, the ceramic substrate cut inward having a sectional area less than that of the ceramic substrate therebelow.

Also, the electrode exposing part 22 may be formed by laminating a ceramic substrate having recessed portions at either end thereof on the top surface of the ceramic substrate forming the body part 21, the ceramic substrate with the recessed portions having a sectional area identical to that of the ceramic substrate therebelow.

Without any limitation the above, the electrode exposing part may be stepped to be upwardly exposed to the outside by inwardly depressing a portion of upper and side surfaces of either side of the body part.

Furthermore, the electrode exposing part may be stepped to be upwardly exposed to the outside by inwardly depressing top and side surfaces of either side of the body part along a lengthwise direction of the body part.

On the other hand, the internal electrode 23 includes one end disposed on the electrode exposing part 22 to be exposed to the outside, and other end extending to the mounting part 25 to be electrically connected to the light emitting diode L.

In this case, the one end disposed on the electrode exposing part 22 may include the top surface upwardly exposed to the outside at either side of the body part 21.

The one end disposed on the electrode exposing part 22 may include the top surface upwardly exposed to the outside and the side surface horizontally exposed to the outside at either side of the body part 21.

As described in FIG. 2a, a ceramic package 20 according to an embodiment of the present invention may include a pair of internal electrodes 23 having different polarity and electrically connected to the light emitting diode L.

That is, if one internal electrode has the negative polarity, the other internal electrode has the positive polarity. Both internal electrodes 23 are electrically connected to the light emitting diode L, respectively.

As described in FIG. 2b, a ceramic package 20 according to another embodiment of the present invention further may include a via hole 27 penetrating the mounting part 26 of the body part 21, and a plating layer 28 under the body part 21 electrically connected to the via hole 27.

In this case, while a pair of the internal electrodes 23 having the same polarity is electrically connected to the light emitting diode L, the via hole 27 and the plating layer 28 having a different polarity from the polarity of the internal electrodes 23 are electrically connected to the light emitting diode L.

That is, when all the internal electrodes 23 has the negative polarity, the via hole 27 and the plating layer 28 having the positive polarity are electrically connected to the light emitting diode L.

On the other hand, the body part 21 further may include a molding member 29 filled in the cavity 25 to cover the light emitting diode L. The molding member may contain a fluorescent substance exited by a light emitted from the light emitting diode L.

The headlamp ceramic package 20 according to an embodiment of the present invention has a structure of upwardly exposing a pair of internal electrodes 23 positioned on the electrode exposing part 22 at either side of the body part 21 to the outside. Accordingly, a limitation of a related art ceramic package caused by both polarities disposed on the same plane can be solved.

Next, a headlamp module according to an embodiment of the present invention is described with reference to FIGS. 3 to 7.

Figure 3:
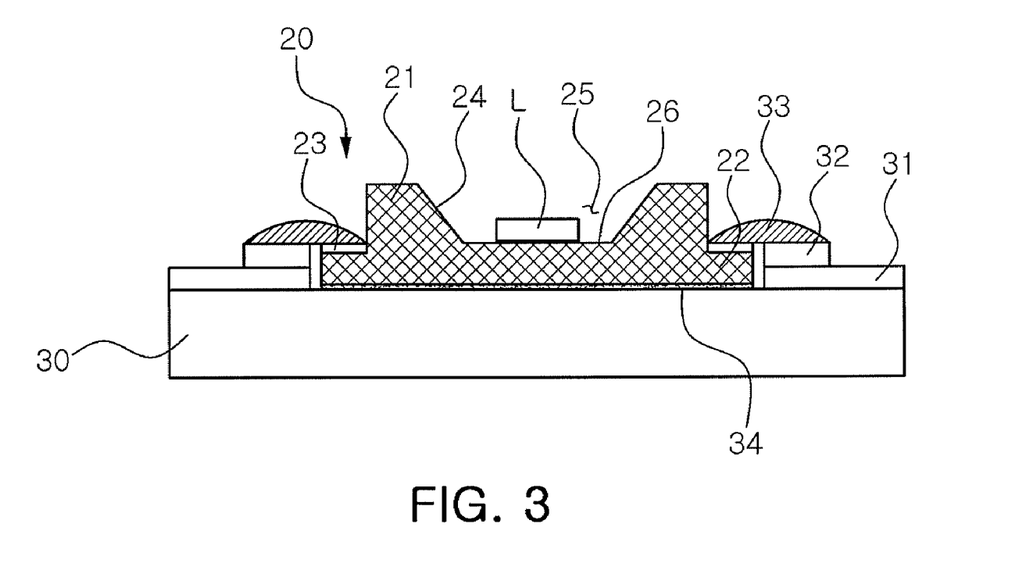
FIG. 3 is a sectional view illustrating a headlamp module including the ceramic package for headlamp as described in FIG. 2a according to an embodiment of the present invention.
Figure 4A:
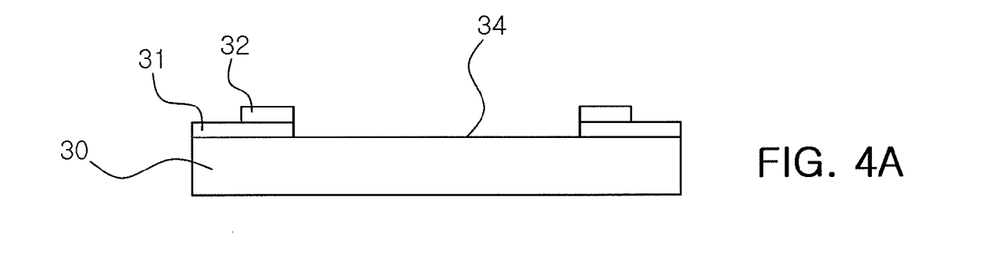
FIGS. 4a and 4b are a sectional view and a plan view illustrating a substrate of the headlamp module in FIG. 3, respectively.
Figure 4B:
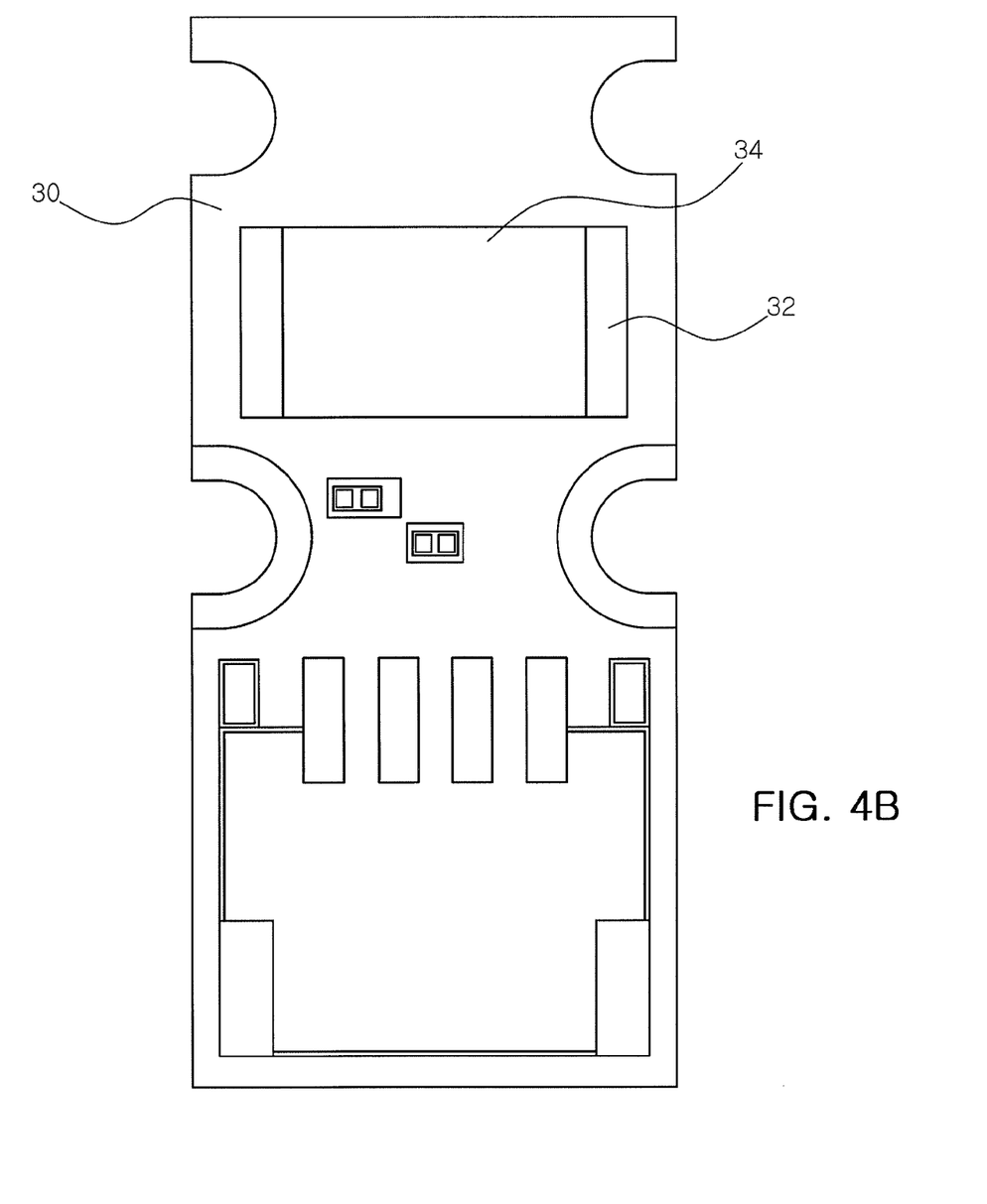
Figure 5A:
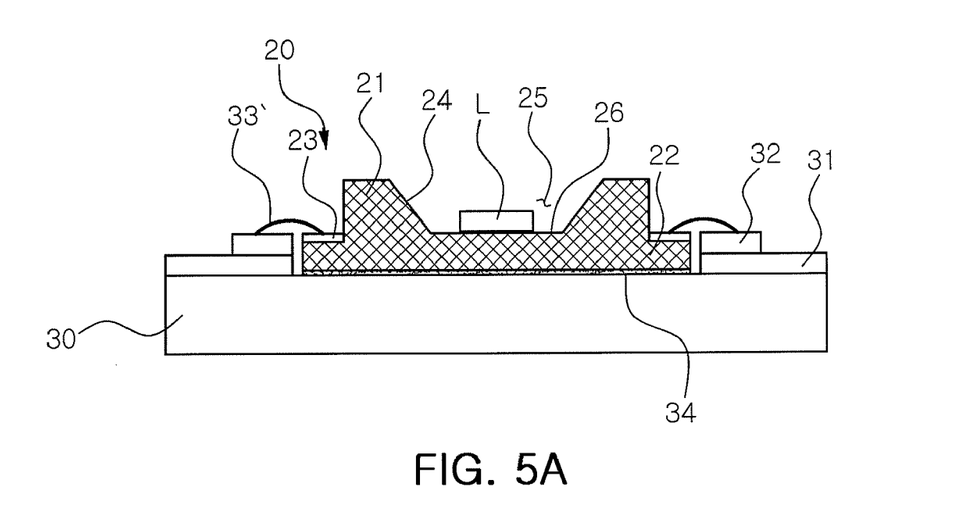
FIG. 5a is a sectional view illustrating a headlamp module including the ceramic package for headlamp as described in FIG. 2a according to another embodiment of the present invention.
Figure 5B:
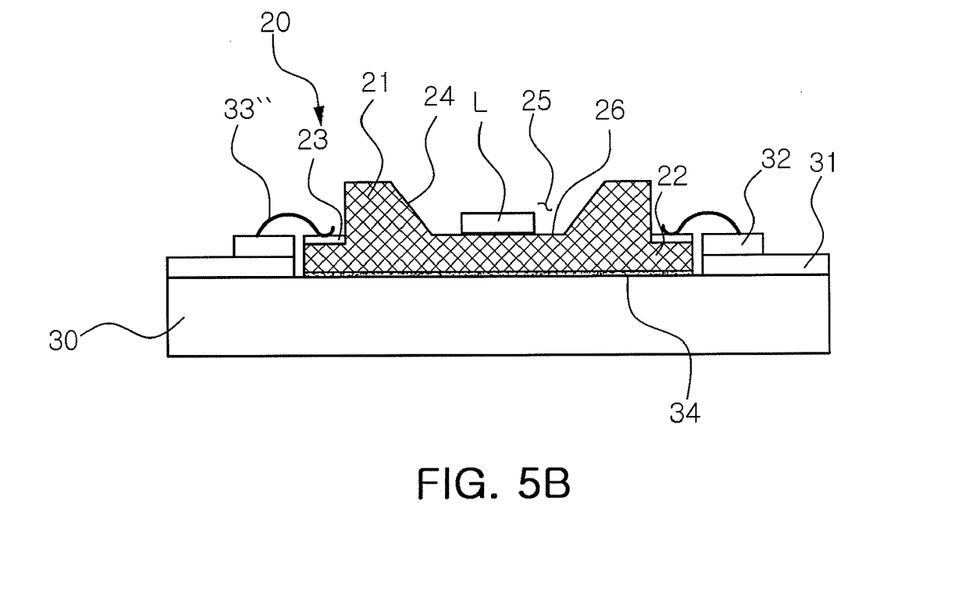
FIG. 5b is a sectional view illustrating a headlamp module including the ceramic package for headlamp as described in FIG. 2a according to still another embodiment of the present invention.

Referring to FIGS. 3 to 5, the headlamp module includes a ceramic package 20 and a substrate 30.

The ceramic package 20 and elements thereof are identical to the headlamp ceramic package (20 in FIGS. 1 and 2a). Accordingly, description thereof will be omitted below.

The substrate 30 supports the ceramic package 20, and electrically connected to the internal electrode 23 of the ceramic package 20. Also, the substrate 30 is a heat transfer conductor dissipating heat generated from the ceramic package.

As described in FIGS. 3 and 4, the substrate 30 includes a seating part 34, an insulating layer 31, and an external electrode 32.

The ceramic package 20 is seated on the seating part 34 disposed at a specific location on the substrate 30, and fixed by an adhesive.

That is, while an insulating layer is additionally intervene between the ceramic package 20 and the substrate 30 in a related art, the ceramic package 20 according to an embodiment of the present invention allows the ceramic package 20 to directly contact the substrate in order to obtain high heat transfer characteristics.

A non-conductive insulating layer 31 is disposed along the outer edge of the seating part 34. Also, an external electrode 32 is patterned on the top surface of the insulating layer 31.

In a preferred embodiment of the present invention, the insulating layer 31 is disposed along the outer edge, but not limited thereto. Accordingly, the insulating layer 31 may cover all the top surface of the substrate 30 except the seating part 34.

As described in FIGS. 3 and 5, when the ceramic package 20 is seated on the seating part 34, the electrode exposing part 22 may face the insulating layer 22.

In this case, the electrode exposing part 22 may have the substantially same height as the insulating layer 31.

As described in FIGS. 3 and 5, the headlamp module according to an embodiment of the present invention may includes a pair of internal electrodes 23 having different polarities, which is electrically connected to the external electrode 32 on the insulating layer 31.

That is, if one end 23 has the negative polarity, other end 23 has the positive polarity.

Figure 6:
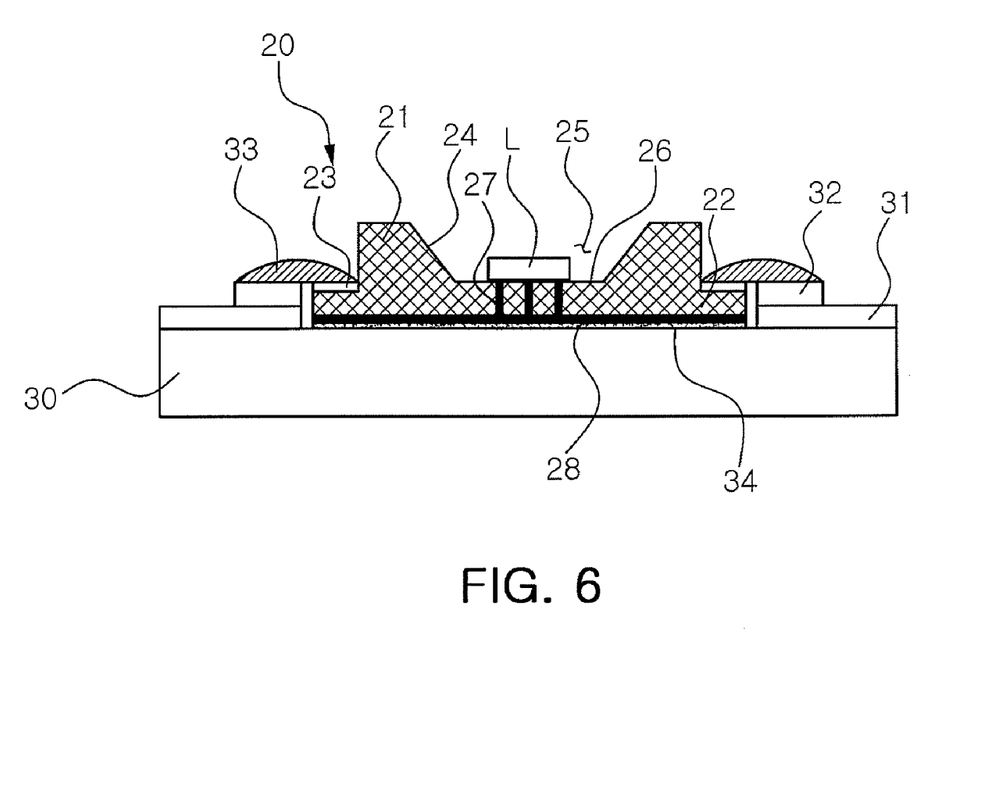
FIG. 6 is a sectional view illustrating a headlamp module including the ceramic package for headlamp as described in FIG. 2b according to an embodiment of the present invention.
Figure 7A:
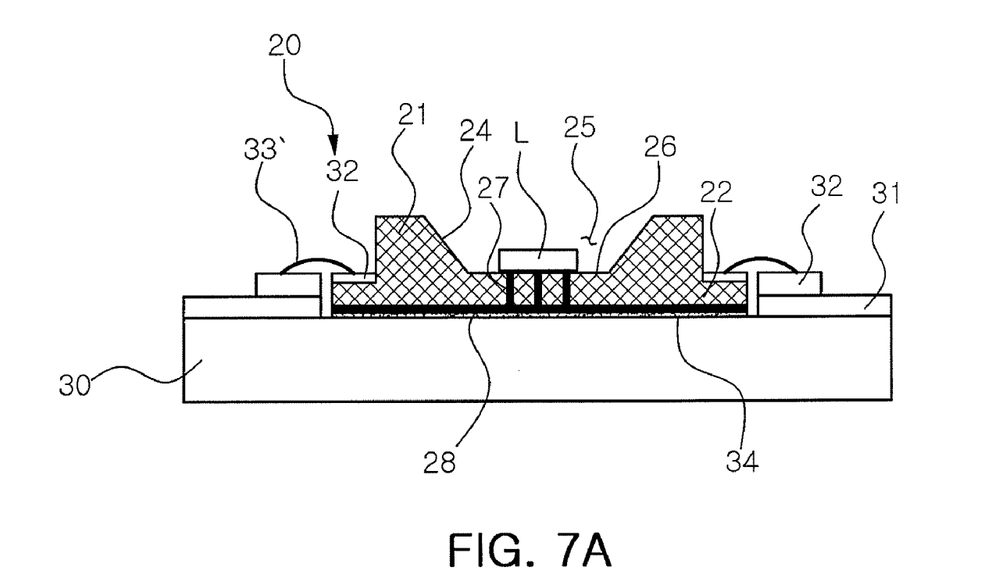
FIG. 7a is a sectional view illustrating a headlamp module including the ceramic package for headlamp as described in FIG. 2b according to another embodiment of the present invention.
Figure 7B:
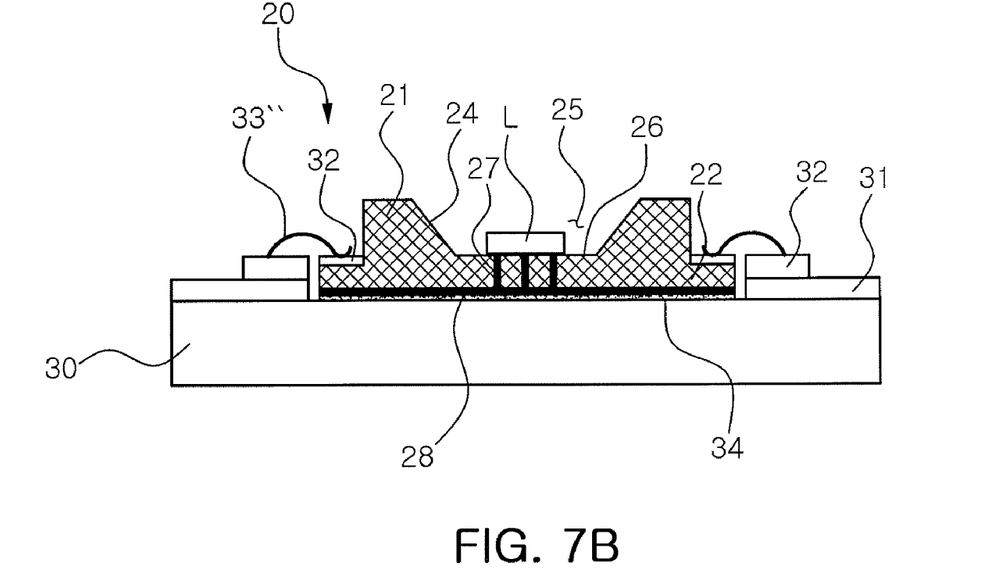
FIG. 7b is a sectional view illustrating a headlamp module including the ceramic package for headlamp as described in FIG. 2b according to still another embodiment of the present invention.

As described FIGS. 6 and 7, a heal lamp module according to another embodiment of the present invention further may include a via hole 27 penetrating the seating part of the body part 21, and a plating layer 28 under the body part 21 electrically connected to the via hole 27.

In this case, a pair of the internal electrodes 23 having the same polarity is electrically connected to the external electrode 32 of the insulating layer 31. Also, the via hole 27 and the plating layer 28 having a different polarity from the internal electrodes 23 are electrically connected to the substrate 30.

That is, if a pair of the internal electrode 23 having the negative polarity is electrically connected to the external electrode 32, the via hole 27 and the plating layer 28 having the positive polarity are electrically connected to the substrate 30.

In this case, an adhesive fixing the ceramic package 20 on the seating part 34 of the substrate 30 may be a conductive paste.

On the other hand, the top surface of the internal electrode 23 may be electrically connected to the top surface of the external electrode 32 using a solder 33, a metal wire 33', or a leaf spring 33".

In the headlamp module according to the embodiments of the present invention, since the internal electrode of the ceramic package is disposed at either side of the body part to be upwardly exposed to the outside, there is no non-conductive insulating layer between the ceramic package and the substrate. Accordingly, high transfer characteristics can be obtained.

Also, since the top surfaces of the internal and external electrodes are electrically connected to each other through a solder bonding, a wire bonding, or a leaf-spring, high reliability can be secured.

Moreover, since both top surfaces of the internal electrode and the external electrode face upward, both electrodes can be more easily connected to each other.

The ceramic package for headlamp and the headlamp module having the same according to the present invention have a simple structure, have an excellent optical efficiency by improving the heat dissipation characteristics through smooth thermal dissipation, and have an excellent reliability by connecting the ceramic package to the substrate in various methods.

Also, all the electrodes of the ceramic package and the substrate face upward, thereby facilitating connection between the electrodes.

While the present invention has been shown and described in connection with the exemplary embodiments, it will be apparent to those skilled in the art that modifications and variations can be made without departing from the spirit and scope of the invention as defined by the appended claims.

What is claimed is:

1. A ceramic package for a headlamp having a light emitting diode, comprising:
    a body part having a cavity formed therein, the cavity being opened upwardly to expose the light emitting diode mounted on a mounting part;

a pair of internal electrodes in the body part electrically connected to the light emitting diode; and an electrode exposing part stepped at either side of the body part to upwardly expose the internal electrode to the outside, wherein the body part further comprises a via hole penetrating the mounting part and a plating layer electrically connected to the via hole, the plating layer disposed below the body part, in contact therewith, and electrically connected to the light emitting diode by the via hole, and wherein the pair of internal electrodes have the same polarity, while the via hole and the plating layer have a polarity different from that of the internal electrodes.

2. The ceramic package for the headlamp of claim 1, wherein the body part is formed by laminating a ceramic substrate manufactured through High Temperature Co-fire Ceramic (HTCC) process.

3. The ceramic package for the headlamp of claim 2, wherein the electrode exposing part is formed by laminating an upper ceramic substrate having either end cut inward along a lengthwise direction of the body part on a top end of a lower ceramic substrate, the upper ceramic substrate cut inward having a sectional area less than that of the lower ceramic substrate.

4. The ceramic package for the headlamp of claim 2, wherein the electrode exposing part is formed by laminating an upper ceramic substrate having recessed portions at either end thereof on a top end of a lower ceramic substrate, the upper ceramic substrate with the recessed portions having a sectional area less than that of the lower ceramic substrate.

5. The ceramic package for the headlamp of claim 1, wherein the electrode exposing part is stepped to be upwardly exposed to the outside by inwardly depressing a portion of upper and side surfaces of either side of the body part.

6. The ceramic package for the headlamp of claim 1, wherein the electrode exposing part is stepped to be upwardly exposed to the outside by inwardly depressing top and side surfaces of either side of the body part along a lengthwise direction of the body part.

7. The ceramic package for the headlamp of claim 1, wherein the top surface of the internal electrode is upwardly exposed to the outside by the electrode exposing part at either side of the body part.

8. The ceramic package for the headlamp of claim 1, wherein the top surface and the side surface of the internal electrode are upwardly and horizontally exposed to the outside by the electrode exposing part at either side of the body part, respectively.

9. The ceramic package for the headlamp of claim 1, wherein the body part comprises a reflection surface downwardly declined toward the bottom surface of the cavity.

10. The ceramic package for the headlamp of claim 1, further comprising a molding member filled in the cavity to cover the light emitting diode.

11. A headlamp module comprising:

a ceramic package comprising a body part having a cavity formed therein, the cavity being upwardly opened to expose a light emitting diode mounted on a mounting part, a pair of internal electrodes in the body part electrically connected to the light emitting diode, and an electrode exposing part stepped at either side of the body part to upwardly expose the internal electrode to the outside; and a substrate comprising a seating part fixed on the ceramic package, an insulating layer disposed along an outer edge of the seating part, and an external electrode patterned on the insulating layer, wherein the ceramic package further comprises a via hole penetrating the mounting part and a plating layer electrically connected to the via hold, the plating layer disposed below the body part, in contact therewith, and electrically connected to the light emitting diode by the via hole, and wherein the internal electrodes have the same polarity and electrically connected to the external electrode on the insulating layer, while the via hole and the plating layer have a polarity different from that of the internal electrodes and electrically connected to the substrate.

12. The headlamp module of claim 11, wherein, when the ceramic package is seated on the seating part, the electrode exposing part faces the insulating layer.

13. The headlamp module of claim 11, wherein the electrode exposing part has the substantially same height as the height of the insulating layer.

14. The headlamp module of claim 11, wherein the internal electrode is electrically connected to the external electrode through one of a solder, a metal wire and a leaf-spring.

* * * * *